(12) United States Patent
Kawahito (10) Patent No.: US 10,402,286 B2
(45) Date of Patent: Sep. 3, 2019

(54) INPUT/OUTPUT SYSTEM, INPUT DEVICE, AND CONTROL METHOD OF INPUT/OUTPUT SYSTEM

(71) Applicant: RENESAS ELECTRONICS CORPORATION, Tokyo (JP)

(72) Inventor: Takayuki Kawahito, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 131 days.

(21) Appl. No.: 15/795,018

(22) Filed: Oct. 26, 2017

(65) Prior Publication Data

US 2018/0145662 A1 May 24, 2018

(30) Foreign Application Priority Data

Nov. 24, 2016 (JP) .................................. 2016-227523

(51) Int. Cl.

| | |
|---|---|
| *G06F 11/16* | (2006.01) |
| *H03K 5/26* | (2006.01) |
| *B60R 16/023* | (2006.01) |
| *H03K 3/037* | (2006.01) |
| *H04N 5/247* | (2006.01) |
| *H03K 19/0175* | (2006.01) |

(52) U.S. Cl.
CPC ............ *G06F 11/16* (2013.01); *B60R 16/023* (2013.01); *H03K 3/037* (2013.01); *H03K 5/26* (2013.01); *H03K 19/017509* (2013.01); *H04N 5/247* (2013.01)

(58) Field of Classification Search
CPC .. H03K 3/037; H03K 5/26; H03K 19/017509; G06F 11/16; G06F 11/1608–162; B60R 16/023; B60R 16/0231
See application file for complete search history.

(56) References Cited

U.S. PATENT DOCUMENTS

| | | | |
|---|---|---|---|
| 6,910,169 B2 | 6/2005 | Sharma | |
| 8,621,272 B2* | 12/2013 | Das | G01R 31/31816 714/10 |
| 9,520,877 B2* | 12/2016 | Meinerzhagen | H03K 5/26 |
| 9,639,488 B2* | 5/2017 | Sadowski | G06F 13/38 |
| 2006/0143551 A1* | 6/2006 | Biswas | G01R 31/318569 714/726 |

FOREIGN PATENT DOCUMENTS

JP 2001-211085 A 8/2001

* cited by examiner

*Primary Examiner* — Patrick O Neill
(74) *Attorney, Agent, or Firm* — McDermott Will & Emery LLP (57) ABSTRACT

The present invention is directed to determine validity of input data without increasing the number of data lines. An input/output system has an output device and an input device. The output device multiplexes data obtained by latching original data at a rising edge of a clock signal and data obtained by latching the original data at a falling edge of the clock signal and inverting the latched data, outputs the resultant data as multiplexed data, and also outputs the clock signal. The input device determines validity of the multiplexed data by comparing data obtained by latching the multiplexed data at a rising edge of the clock signal and data obtained by latching the multiplexed data at a falling edge of the clock signal and inverting the latched data.

11 Claims, 9 Drawing Sheets

INPUT/OUTPUT SYSTEM, INPUT DEVICE, AND CONTROL METHOD OF INPUT/OUTPUT SYSTEM

CROSS-REFERENCE TO RELATED APPLICATIONS

The disclosure of Japanese Patent Application No. 2016-227523 filed on Nov. 24, 2016 including the specification, drawings and abstract is incorporated herein by reference in its entirety.

BACKGROUND

The present invention relates to an input/output system having an output device and an input device and, for example, can be suitably used for an input/output system in which an input device determines validity of data input from an output device.

In recent years, the number of in-vehicle MCUs (Micro Control Units) mounted in vehicles and having an interface function for inputting image data is increasing. For example, a dashboard MCU mounted in a dashboard of a vehicle performs operation of inputting image data of the periphery of the vehicle captured by cameras and displaying the input image data to a dashboard panel. Consequently, it is an important function for an in-vehicle MCU to assure validity of input data also from the viewpoint of safety, and the measure for it is an urgent task.

Hereinafter, three related arts regarding assurance of validity of data which is input to an MCU will be described.
(1) AMI Coding (Alternative Mark Inversion Code) Method The AMI coding method is one of coding methods used for digital communication. The AMI code is a code expressing 0 when the logical state "0" is generated in data and expressing a positive or negative polarity code when the logical state "1" is generated. In the AMI code, each time the logical state "1" is generated in data, the positive and negative polarity codes are alternately repeated. Consequently, the data waveform includes little DC components, is close to an AC signal, and is unsusceptible to noise or the like, so that stable data transmission can be performed.
(2) ECC (Error Correction Code)

The error correction code is a code added to data so that a receiver side can detect and correct an error which occurs at the time of recording/transmitting data (refer to, for example, patent literature 1). The error correction code is calculated from original data on the basis of a predetermined procedure and recorded/transmitted together with the original data.
(3) Multiplexing of Data Lines Multiplexing of data lines denotes multiplexing of data lines between a transmitter side and a receiver side. For example, in the case of duplicating data lines, the transmitter side transmits the same data by two data lines. The receiver side determines whether the data is valid or not by comparing the data transmitted by the two data lines.

RELATED ART LITERATURE

Patent Literature

Patent Literature 1: Japanese Unexamined Patent Application Publication No. 2001-211085

SUMMARY

The above-described three related arts have, however, the following problems.

(1) Problem of AMI Coding Method

In the AMI coding method, when the logical state "0" is generated successively in data, no change occurs in an AMI code. Consequently, validity of the data cannot be determined.
(2) Problem of Error Correction Code (ECC)

To add an error correction code, for example, in the case of image data of 24 bits, an error correction code of seven bits is necessary, and the number of data lines between the transmitter side and the receiver side increases. When the number of data lines increases, the manufacture cost of the system increases (the number of terminals of the MCU increases and the number of board lines increases) and wiring implementation becomes difficult.
(3) Problem of Multiplexing of Data Lines By multiplexing data lines, the number of data lines increases as compared with the case where the data lines are not multiplexed (the number becomes double in the case of duplication). When the number of data lines increases, the manufacture cost of the system increases (the number of terminals of the MCU increases and the number of board lines increases) and wiring implementation becomes difficult.

The other problems and novel features will become apparent from the description of the specification and appended drawings.

According to an embodiment, an input/output system has an output device and an input device. The output device multiplexes data obtained by latching original data at a rising edge of a clock signal and data obtained by latching the original data at a falling edge of the clock signal and inverting the latched data, outputs the resultant data as multiplexed data, and also outputs the clock signal. The input device determines validity of the multiplexed data by comparing data obtained by latching the multiplexed data at a rising edge of the clock signal and data obtained by latching the multiplexed data at a falling edge of the clock signal and inverting the latched data.

The embodiment can contribute to solve the above-described problems.

DETAILED DESCRIPTION

Hereinafter, an embodiment of the present invention will be described. To make description clear, the following description and drawings are properly omitted and simplified. In the drawings, the same reference numeral is designated to the same elements and description will not be repeated as necessary.

Application Example of Embodiment

First, an application example of an input/output system according to the embodiment will be described. The input/output system according to the embodiment can be applied to, for example, an in-vehicle system mounted and used in a vehicle.

Figure 1:
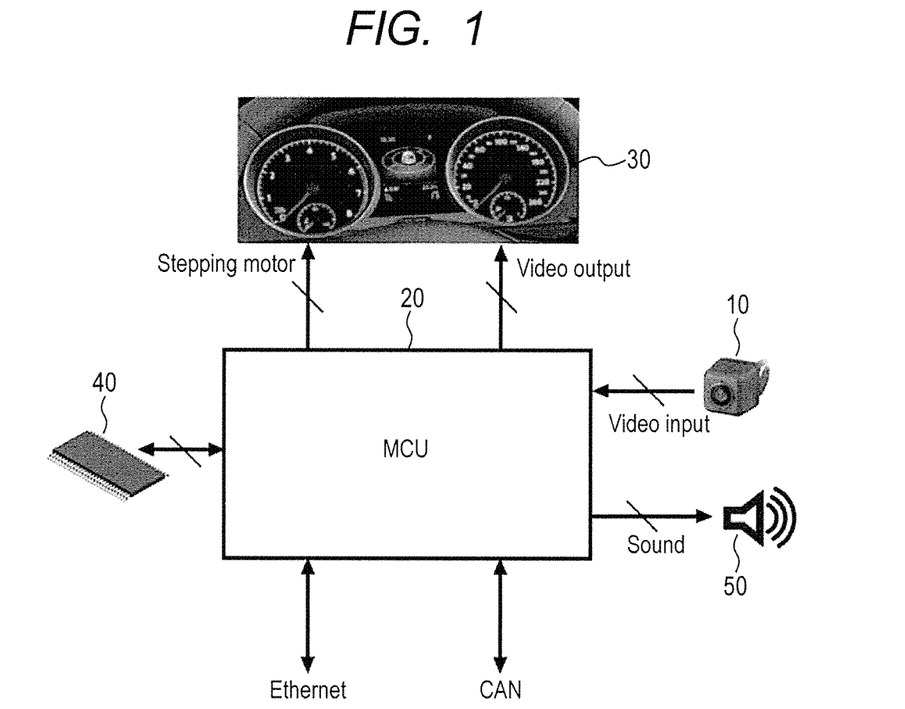
FIG. 1 is a diagram illustrating a configuration example of an in-vehicle system to which an input/output system according to an embodiment is applied.

With reference to FIG. 1, the configuration of an in-vehicle system to which the input/output system according to the embodiment is applied will be described. An in-vehicle system illustrated in FIG. 1 has a camera module 10, an MCU 20, a display 30, an ExtMEM (External Memory) 40, and a speaker 50.

Figure 2:
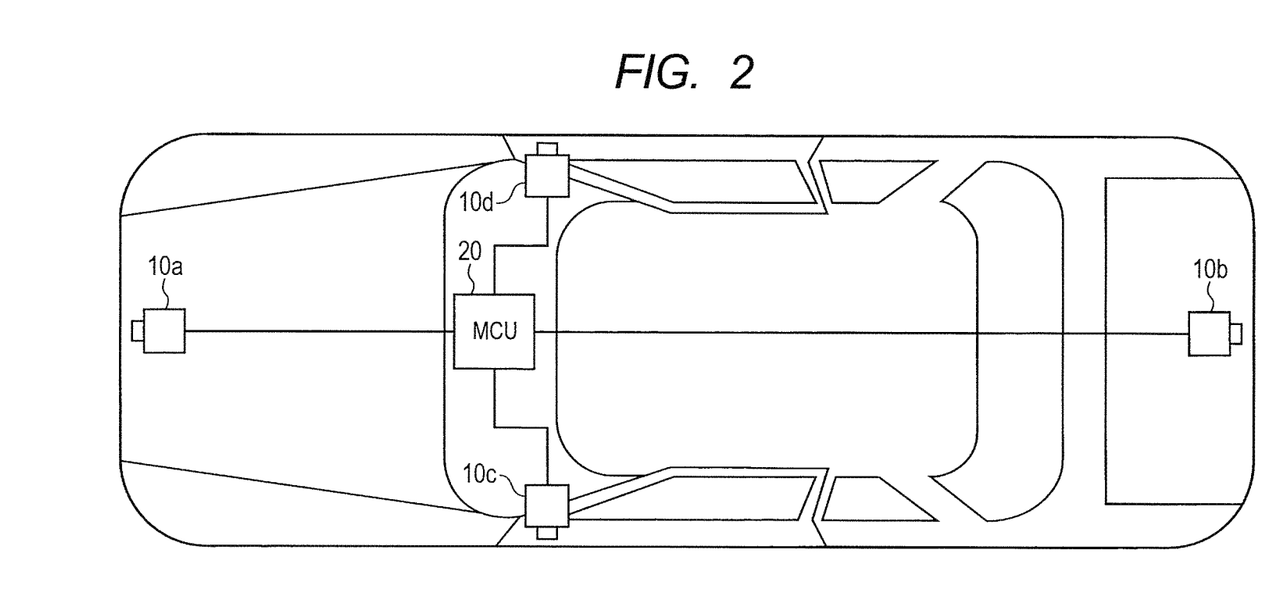
FIG. 2 is a diagram illustrating an arrangement example of an MCU and camera modules depicted in FIG. 1.

The camera module 10 captures images of the periphery of a vehicle and, for example, as illustrated in FIG. 2, four camera modules 10a to 10d are disposed. The camera module 10a is disposed in a front part in the vehicle and captures images of the forward of the vehicle. The camera module 10b is disposed in a rear part in the vehicle and captures images of the backward of the vehicle. The camera module 10c is disposed in a left part in the vehicle and captures images of the left side of the vehicle. The camera module 10d is disposed in a right part in the vehicle and captures images of the right side of the vehicle. Hereinafter, in the case of referring to the camera modules 10a to 10d without distinguishing them, they will be also simply called "camera modules 10". The camera modules 10 output image data obtained by capturing images by themselves to the MCU 20.

The display 30 is a dashboard panel disposed in the dashboard of the vehicle. The display 30 displays the image data output from the MCU 20 (for example, image data of the periphery of the vehicle captured by the camera modules 10) and a speed indicator on the basis of information such as engine rotational speed obtained from the MCU 20.

The ExtMEM 40 is an external memory to/from which data is written/read by the MCU 20 and is realized by, for example, an SDRAM (Synchronous Dynamic Random Access Memory).

The speaker 50 audio-outputs sound data output from the MCU 20.

The MCU 20 is a dashboard MCU and is disposed, for example, in the dashboard of a vehicle as illustrated in FIG. 2. As described above, the MCU 20 receives image data from the camera module 10, outputs the input image data to the display 30, reads/writes data from/to the external memory 40, and outputs sound data to the speaker 50. The MCU 20 also transmits/receives various data to/from other components via the Ethernet (registered trademark) or the CAN (Controller Area Network). For example, the MCU 20 outputs information such as engine rotational speed to a stepping motor and the display 30.

The input/output system according to the embodiment can be applied, for example, as a system for input/output of data performed between the camera module 10 and the MCU 20. Hereinafter, an example of the case of applying the input/output system according to the embodiment as a system for input/output of data performed between the camera module 10 and the MCU 20 illustrated in FIGS. 1 and 2 will be described.

Configuration of Embodiment

Figure 3:
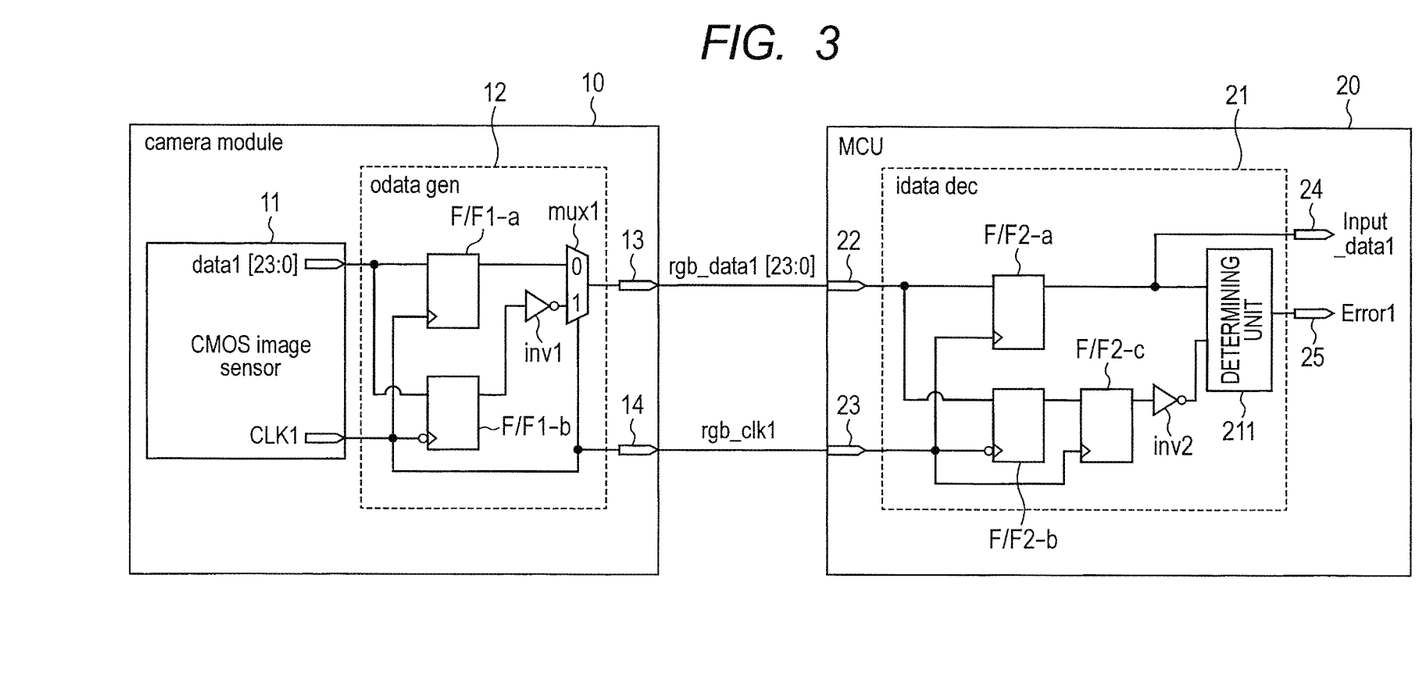
FIG. 3 is a circuit diagram illustrating a configuration example of the input/output system according to the embodiment.

Subsequently, with reference to FIG. 3, the configuration of the input/output system according to the embodiment will be described. The input/output system illustrated in FIG. 3 has the camera module 10 and the MCU 20 depicted in FIGS. 1 and 2. The camera module 10 is an example of the output device, and the MCU 20 is an example of the input device.

The camera module 10 has a CMOS (Complementary Metal Oxide Semiconductor) image sensor 11, an output data generator (odata gen) 12 as an output control unit, and terminal units 13 and 14. The camera module 10 outputs original data (data1) obtained by the CMOS image sensor 11 as data (rgb_data1) synchronized with the fall and the rise of a clock signal (CLK1) to the MCU 20.

The CMOS image sensor 11 outputs, for example, data1 as image data of 24 bits in the RGB format as a known image format obtained by capturing an image by a camera (not illustrated) synchronously with the rise of CLK1.

The output data generator 12 has a flip flop F/F1-a, a flip flop F/F1-b, an inverter inv1, and a multiplexer mux1. The flip flop F/F1-a is a flip flop circuit latching data1 output from the CMOS image sensor 11 at the rising edge of CLK1 and an example of a first output-side flip flop circuit. The flip flop F/F1-b is a flip flop circuit latching data1 output from the CMOS image sensor 11 at the falling edge of CLK1 and an example of a second output-side flip flop circuit. The inverter inv1 is an inverter element inverting output data of the flip flop F/F1-b and an example of an output-side inverter. The multiplexer mux1 is a multiplexer selecting and outputting output data of the flip flop F/F1-a in a state where CLK1 is at the low level and selecting and outputting output data of the inverter inv1 in a state where CLK1 is at the high level. By the operation of the multiplexer mux1, the two pieces of data latched at the rising and falling edges of CLK1 are multiplexed. The multiplexed data is output from the multiplexer mux1 as rgb_data1 as the image data of 24 bits.

The terminal unit 13 is a terminal outputting rgb_data1 output from the multiplexer mux1 to the MCU 20 and an example of a first output terminal. Hereinafter, the terminal unit 13 will be properly also called "rgb_data1-a terminal unit 13". The terminal unit 14 is a terminal outputting CLK1 as rgb_clk1 to the MCU 20 and an example of a second output terminal.

The MCU 20 has an input data decoder 21 as an input control unit and terminal units 22 to 25.

The terminal unit 22 is a terminal receiving rgb_data1 output from the camera module 10 and an example of a first input terminal. Hereinafter, the terminal unit 22 will be also properly called "rgb_data1-b terminal unit 22". The terminal unit 23 is a terminal receiving rgb_clk1 output from the camera module 10 and an example of a second input terminal.

The input data decoder 21 has a flip flop F/F2-a, a flip flop F/F2-b, a flip flop F/F2-c, an inverter inv2, and a determining unit 211. The flip flop F/F2-a is a flip flop circuit latching rgb_data1 received from the rgb_data1-b terminal unit 22 at the rising edge of rgb_clk1 and an example of a first input-side flip flop circuit. The flip flop F/F2-b is a flip flop circuit latching rgb_data1 input from the rgb_data1-b terminal unit 22 at the falling edge of rgb_clk1 and an example of a second input-side flip flop circuit. The flip flop F/F2-c is a flip flop circuit making output data of the flip flop F/F2-b synchronized with the rising edge of rgb_clk1 and an example of a third input-side flip flop circuit. The inverter inv2 is an inverter element of inverting output data of the flip flop F/F2-c and an example of an input-side inverter. The determining unit 211 logically compares output data of the flip flop F/F2-a synchronized with the rising edge of rgb_clk1 and output data of the inverter inv2 which is synchronized with the falling edge of rgb_clk1 and inverted by a comparison circuit such as an XOR circuit. The determining unit 211 determines validity of rgb_data1 on the basis of the comparison result and generates and outputs Error1 as an error determination signal indicating the determination result. When the comparison result indicates a match, the determining unit 211 determines that rgb_data1 is valid and makes Error1 leave at the low level. On the other hand, when the comparison result indicates a mismatch, the determining unit 211 determines that rgb_data1 is invalid and changes Error1 to the high level to notify the inside of the MCU 20 that rgb_data1 is invalid.

The terminal unit 24 is a terminal outputting output data of the flip flop F/F2-a as Input_data1 to a circuit at the post stage in the MCU 20 and an example of a third output terminal. When the determining unit 211 determines that rgb_data1 is valid, it is understood that Input_data1 is data1 output from the CMOS image sensor 11 and correctly restored.

The terminal unit 25 is a terminal outputting Error1 output from the determining unit 211 to a circuit in the post stage in the MCU 20 and an example of a fourth output terminal.

In the specification, rgb_data1 refers to any of data on a data line extending from the multiplexer mux1 in the camera module 10 to the rgb_data1_a terminal unit 13, data on data lines extending from the rgb_data1-b terminal unit 22 in the MCU 20 to the flip flops F/F2-a and F/F2-b, and data on a data line extending from the rgb_data1-a terminal unit 13 in the camera module 10 to the rgb_data1-b terminal unit 22 in the MCU 20.

Operation of Embodiment

Subsequently, the operation of the input/output system according to the embodiment will be described. First, with reference to FIG. 4, an operation example in the case where rgb_data1 input to the MCU 20 is valid will be described.

Figure 4:
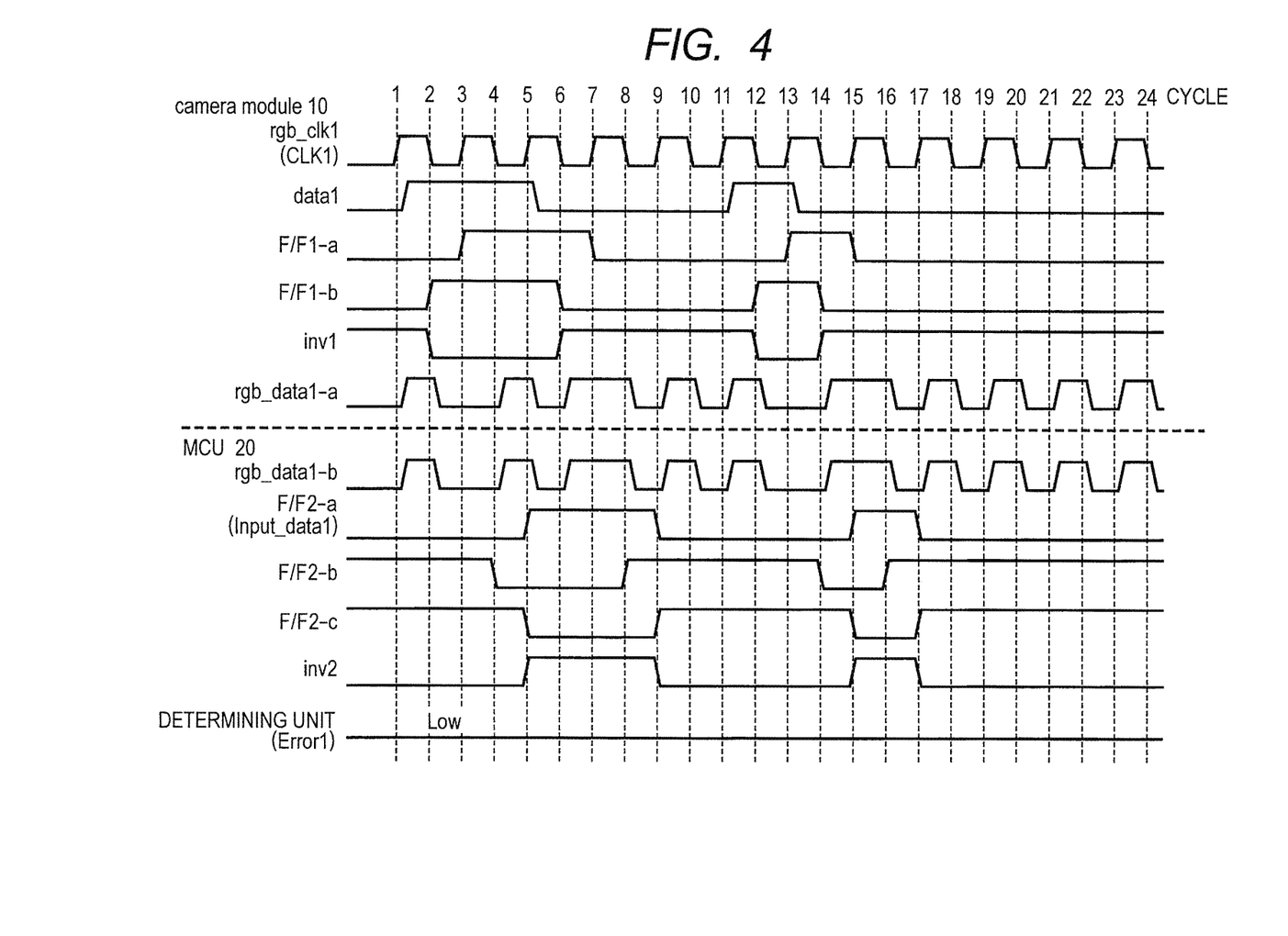
FIG. 4 is a timing chart illustrating an operation example of the input/output system depicted in FIG. 3.

The upper part of FIG. 4 expresses the states of data in the camera module 10. "rgb_clk1 (CLK1)" and "data1" indicate CLK1 and data1 output from the camera module 10, respectively. "F/F1-a" expresses output data of the flip flop F/F1-a, "F/F1-b" expresses output data of the flip flop F/F1-b, "inv1" expresses output data of the inverter inv1, and "rgb_data1-a" indicates rgb_data1 which reached the rgb_data1-a terminal unit 13. The lower part of FIG. 4 expresses the states of data in the MCU 20. "rgb_data1-b" indicates rgb_data1 which reached the rgb_data1-a terminal unit 22, "F/F2-a (Input_data1)" expresses output data of the flip flop F/F2-a, "F/F2-b" expresses output data of the flip flop F/F2-b, "F/F2-c" expresses output data of the flip flop F/F2-c, "inv2" expresses output data of the inverter inv2, and "determining unit (Error1)" indicates Error1 output from the determining unit 211. In FIG. 4, the camera module 10 deals data1 as a signal of one bit so that data1 can be easily determined (also in FIGS. 5 and 6).

In the camera module 10, the flip flop F/F1-a fetches data1 at timings of odd-numbered cycles 1, 3, 5 . . . as edge timings of rising edges of CLK1. The flip flop F/F1-b fetches data1 at timings of even-numbered cycles 2, 4, 6 . . . as edge timings of falling edges of CLK1.

In the flip flop F/F1-a, the first high state of data1 is observed at the timing of the cycle 3, and the logic of the output data shifts to the high level. In the flip flop F/F1-b, the first high state of data1 is observed at the timing of the cycle 2, and the logic of the output data shifts to the high level. The logic of the output data of the flip flop F/F1-b is inverted by the inverter inv1.

In the multiplexer mux1, between the edge timings of the odd-numbered cycle and the even-numbered cycle such as between the cycles 1 and 2 and between the cycles 3 and 4, the output data of the inverter inv1 is selected. In the multiplexer mux1, between the edge timings of the even-numbered cycle and the odd-numbered cycle such as between the cycles 2 and 3 and between the cycles 4 and 5, the output data of the flip flop F/F1-a is selected. In such a manner, rgb_data1 is generated by the multiplexer mux1. For example, between the cycles 1 and 2, the output data of the inverter inv1 is selected, and the logic of rgb_data1 becomes the high level. Between the cycles 2 and 3, the output data of the flip flop F/F1-a is selected, and the logic becomes the low level.

In other words, rgb_data1 generated by the multiplexer mux1 becomes data inverted after 0.5 clock of data1 in the state where CLK1 is at the high level, and becomes data delayed for one clock of data1 in the state where CLK1 is at the low level. rgb_data1 is output from the multiplexer mux1 to the MCU 20 via the rgb_data1-a terminal unit 13. CLK1 is output as rgb_clk1 from the terminal unit 14 to the MCU 20.

In the MCU 20, the flip flop F/F2-a fetches rgb_data1 at timings of odd-numbered cycles 1, 3, 5 . . . as edge timings of rising edges of rgb_clk1. The flip flop F/F2-b fetches rgb_data1 at timings of even-numbered cycles 2, 4, 6 . . . as edge timings of the falling edges of rgb_clk1.

The waveform delayed from the output data of the flip flop F/F1-a by one clock becomes output data of the flip flop F/F2-a. The waveform delayed from the output data of the inverter inv1 by one clock becomes output data of the flip flop F/F2-b. Further, the flip flop F/F2-c fetches the output data of the flip flop F/F2-b at the timings of the odd-numbered cycles 1, 3, 5 . . . so that the output timings of the output data of the flip flop F/F2-c and those of the output data of the flip flop F/F2-a become the same.

Since the output data of the flip flop F/F2-c is obtained by inverting the original data data1, by further inverting it by the inverter inv2, the logic of the output data becomes positive with respect to data1.

Therefore, the output data of the inverter inv2 and the output data of the flip flop F/F2-a become the same logic at the same timing. Consequently, when the logics of both of the data are compared in the determining unit 211, the comparison result indicates a match, and the logic of Error1 remains the low level.

As described above, by comparing the output data of the inverter inv2 and the output data of the flip flop F/F2-a, the determining unit 211 can determine that the value of rgb_data1 input to the MCU 20 is valid. The determining unit 211 outputs Error1 indicating the result of determination that rgb_data1 is valid from the terminal unit 24 to a circuit in the post stage in the MCU 20. By the operation, whether rgb_data1 is valid or not can be informed to the circuit in the post stage. When the determining unit 211 determines that rgb_data1 is valid, it is understood that Input_data1 is data1 which is output from the CMOS image sensor 11 and correctly restored. Consequently, by outputting the output data of the flip flop F/F2-a as Input_data1 from the terminal unit 25 to the circuit in the post stage in the MCU 20, the circuit in the post stage can use the data which is output from the camera module 10 and restored to the same data as data1.

Subsequently, with reference to FIG. 5, an operation example in the case where rgb_data1 input to the MCU 20 is invalid due to characteristic degradation of the data line between the rgb_data1-*a* terminal unit 13 and the rgb_data1-*b* terminal unit 22 will be described.

At the timing of the cycle 2, the logic of rgb_data1 which reached the rgb_data1-*b* terminal unit 22 is to be the high level since the output data of the inverter inv1 is reflected like rgb_data1 which reached the rgb_data1-*a* terminal unit 13. In FIG. 5, however, characteristic degradation such as crosstalk occurs in the data line extending from the rgb_data1-*a* terminal unit 13 to the rgb_data1-*b* terminal unit 22. Consequently, rgb_data1 which reached the rgb_data1-*b* terminal unit 22 does not reach the high-level voltage due to voltage magnitude insufficiency or the like, and its logic is low.

Since the logic of rgb_data1 which reached the rgb_data1-*b* terminal unit 22 is low between the cycles 1 and 2, the flip flop F/F2-*b* latches the low level of rgb_data1 at the timing of the cycle 2. Consequently, the logic of the output data of the flip flop F/F2-*b* becomes the low at the timing of the cycle 2. The low level is synchronized with the rising edge of rgb_clk1 and, after that, inverted by the inverter inv2, and the logic becomes high. The high level appears in the cycle 3 of the output data of the inverter inv2.

Therefore, when the logic of the output data of the flip flop F/F2-*a* and that of the output data of the inverter inv2 are compared at the timing of the cycle 3, they do not match. Consequently, rgb_data1 is determined to be invalid, and the logic of Error1 becomes high. The fact that rgb_data1 input to the MCU 20 is invalid is notified to the circuit in the post stage in the MCU 20.

Figure 5:
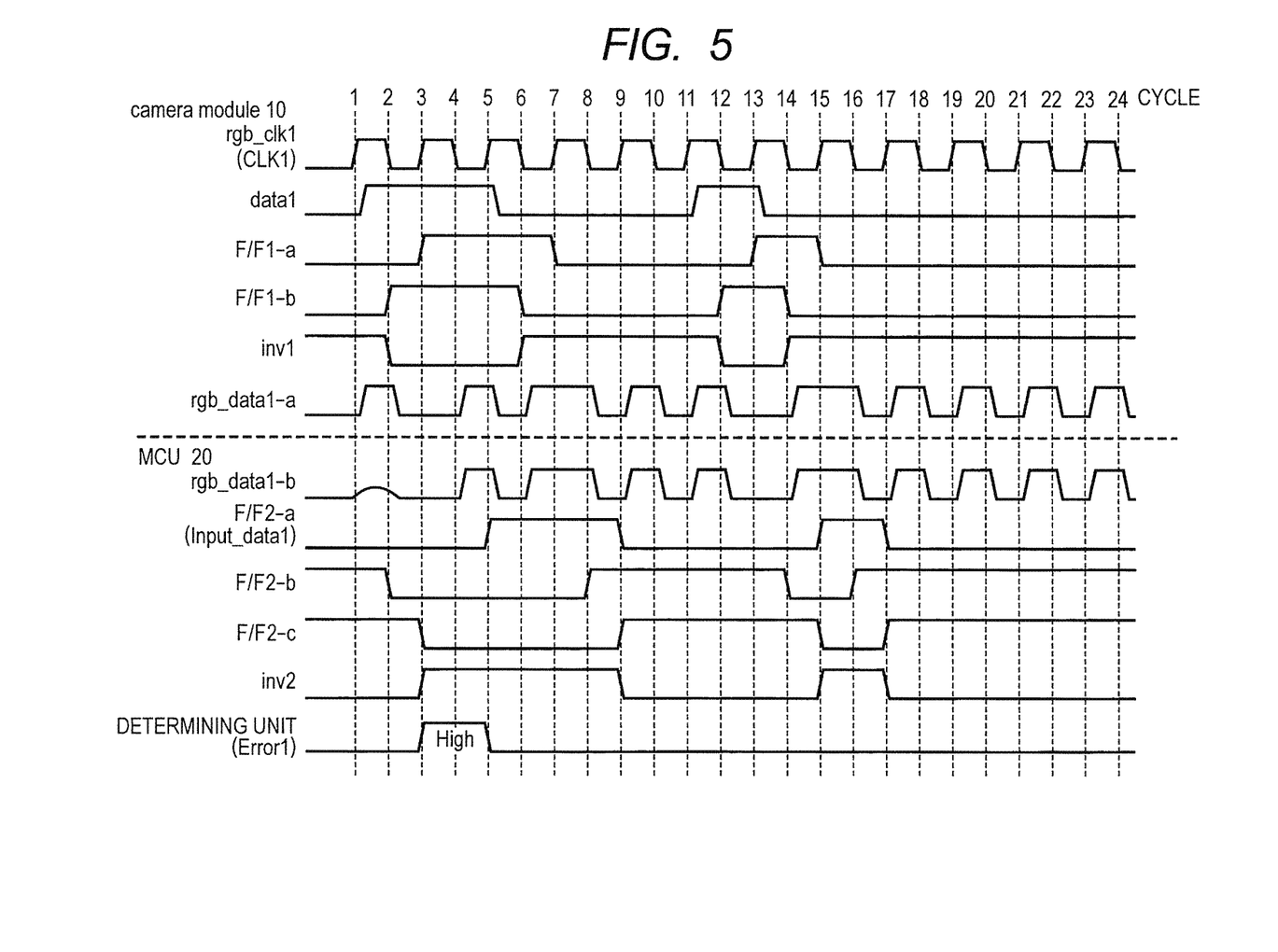
FIG. 5 is a timing chart illustrating an operation example of the input/output system depicted in FIG. 3.

In FIG. 5, the logic of Error1 is the high level only in one clock of rgb_clk1. The circuit at the post stage to which Error1 is output may detect the high level in a clock synchronized with rgb_clk1 or a clock higher than rgb_clk1.

Subsequently, with reference to FIG. 6, an operation example in the case where rgb_data1 input to the MCU 20 is invalid due to disconnection of the data line between the rgb_data1-*a* terminal unit 13 and the rgb_data1-*b* terminal unit 22 will be described.

Figure 6:
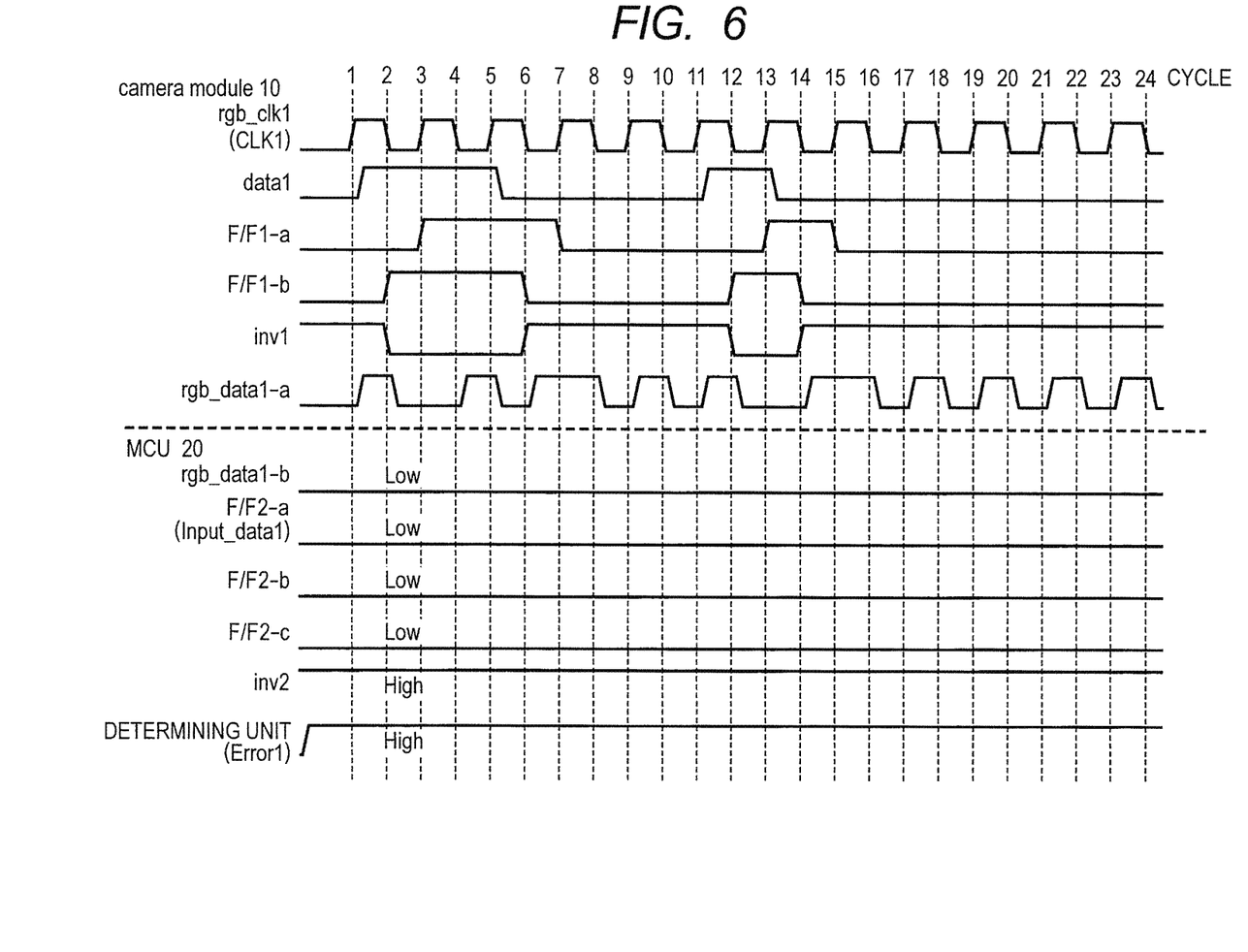
FIG. 6 is a timing chart illustrating an operation example of the input/output system depicted in FIG. 3.

In FIG. 6, disconnection occurs in the data line between the rgb_data1-*a* terminal unit 13 and the rgb_data1-*b* terminal unit 22, and the logic of rgb_data1 which reached the rgb_data1-*b* terminal 22 is fixed to the low state by pull-down resistance or the like.

Consequently, the logic of any of the output data of the flip flops F/F2-*a*, F/F2-*b*, and F/F2-*c* becomes the low level. When the output data of the flip flop F/F2-*c* is inverted by the inverter inv2, the logic of the output data of the inverter inv2 becomes the high level.

Therefore, in the determining unit 211, when the logic of the output data of the flip flop F/F2-*a* and that of the output data of the inverter inv2 are compared, they do not match. rgb_data1 is determined to be invalid and the logic of Error1 becomes the high level. The fact that rgb_data1 input to the MCU 20 is invalid is notified to the circuit at the post stage in the MCU 20.

Concrete Example of Embodiment

Subsequently, with reference to FIGS. 7 and 8, a more concrete configuration in the case of applying the input/output system according to the embodiment to the in-vehicle system illustrated in FIGS. 1 and 2 will be described.

An input/output system illustrated in FIG. 7 will be described. The input/output system illustrated in FIG. 7 is obtained by adding a VIN IP (Video Input Intellectual Property) 201, a CPU (Central Processing Unit) 202, a VO IP (Video Output Intellectual Property) 203, an SRAM (Static Random Access Memory) 204, and an ExtMEMC (External Memory Controller) 205 at the post stage of the input data decoder 21 in the MCU 20 in the input/output system of FIG. 3.

The VIN IP 201, the CPU 202, the VO IP 203, the SRAM 204, and the external memory controller 205 are mutually coupled via a system bus based on the AXI (Advanced eXtensible Interface) bus protocol or the like as a known bus standard. The VIN IP 201 is coupled to the input data decoder 21 via the terminal unit 24, and the CPU 202 is coupled to the input data decoder 21 via the terminal unit 25. In FIG. 7, the terminal terminals 24 and 25 are not illustrated. The VO IP 203 is coupled to the display 30 illustrated in FIG. 1 and the external memory controller 205 is coupled to the external memory 40 illustrated in FIG. 1.

The VIN IP 201 is an image input IP fetching Input_data1 from the input data decoder 21. The CPU 202 fetches Error1 from the input data decoder 21 and processes the fetched Error1. The VO IP 203 is an image output IP outputting Input_data1 fetched by the VIN IP 201 to the display 30. The SRAM 204 is an internal memory storing Input_data1 fetched by the VIN IP 201. The external memory controller 205 is an external memory controller storing Input_data1 fetched by the VIN IP 201 into the external memory 40 as an external memory.

Figure 7:
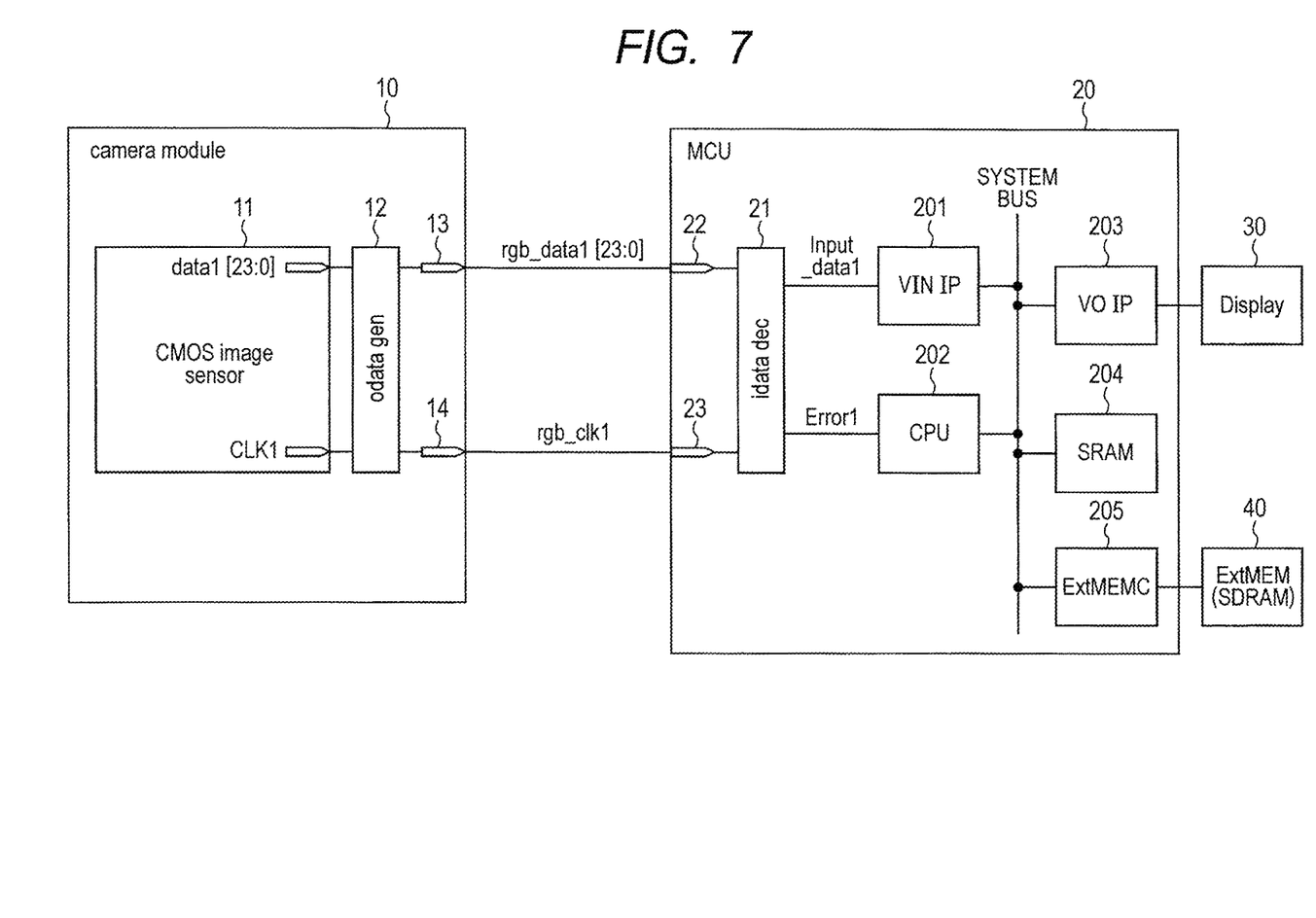
FIG. 7 is a circuit diagram illustrating a concrete configuration example of the input/output system depicted in FIG. 3.

In the input/output system illustrated in FIG. 7, Input_data1 output from the input data decoder 21 is fetched by the VIN IP 201 and expanded on the system bus line. On the system bus line, Input_data1 is stored in a storage designated by an address or the like by the VIN IP 201. The storage may be the SRAM 204 or the external memory 40 coupled to the external memory controller 205. Input_data1 expanded on the system bus line may be output to the display 30 by the VO IP 203 and displayed in the display 30.

Error1 output from the input data decoder 21 is fetched by the CPU 202. In the case where the logic of Error1 is high, the CPU 202 may execute an error process as an interrupt process.

Next, an input/output system illustrated in FIG. 8 will be described. The input/output system illustrated in FIG. 8 is different from the input/output system illustrated in FIG. 7 with respect to the points that the CPU 202 is replaced by an error processing IP 206, and a terminal unit 207 is added. Hereinafter, the points different from the input/output system illustrated in FIG. 7 will be described.

The error processing IP 206 is coupled to the input data decoder 21 via the terminal unit 25, fetches Error1 from the input data decoder 21, and processes the fetched Error1. In FIG. 8, the terminal units 24 and 25 are omitted. The error processing IP 206 is coupled to the system bus line and also coupled to the outside of the input/output system via the terminal unit 207. The VIN IP 201, the error processing IP 206, the VO IP 203, the SRAM 204, and the external memory controller 205 are mutually coupled via a system reset line.

Figure 8:
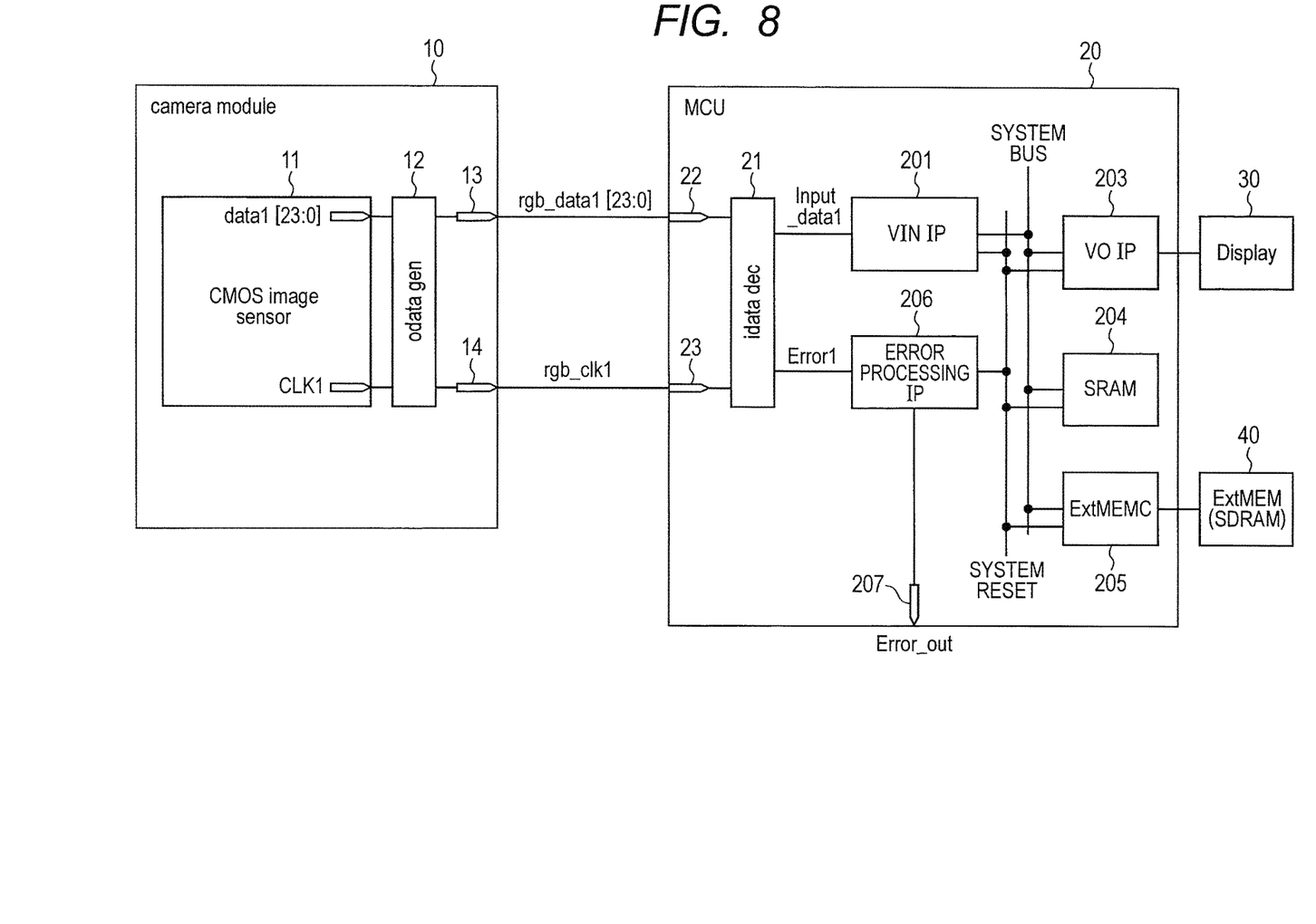
FIG. 8 is a circuit diagram illustrating a concrete configuration example of the input/output system depicted in FIG. 3.

In the input/output system illustrated in FIG. 8, Error1 output from the input data decoder 21 is fetched by the error processing IP 206. When the logic of Error1 is high, the error processing IP 206 may notify occurrence of abnormality in the input/output system to the outside (for example, an LED for alarm) of the input/output system via the terminal unit 207. Alternatively, when the logic of Error1 is high, the error processing IP 206 may issue an initialization signal to the VIN IP 201, the VO IP 203, the SRAM 204, and the external memory controller 205 via the system reset line to initialize the MCU 20. The process for Input_data1 output from the input data decoder 21 is similar to that in the input/output system illustrated in FIG. 7.

Effects of Embodiment

As described above, according to the embodiment, the camera module 10 outputs data obtained by latching data1 at the rising edge of rgb_clk1 and data obtained by latching data1 at the falling edge of rgb_clk1 and latching it. Since one of the data is synchronized with the rising edge of rgb_clk1 and the other data is synchronized with the falling edge of rgb_clk1, the camera module 10 multiplexes the two pieces of data and outputs the multiplexed data as rgb_data1. Since rgb_data1 is multiplexed as described above, it can be output from the camera module 10 to the MCU 20 via a single data line. The MCU 20 determines validity of rgb_data1 by comparing the data obtained by latching rgb_data1 at the rising edge of rgb_clk1 and the data obtained by latching rgb_data1 at the falling edge and inverting it.

For example, the related art of adding an error correction code and the related art of multiplexing data lines have a problem that the number of data lines increases as described above. On the other hand, in the embodiment, the camera module 10 outputs the multiplexed rgb_data1 via a single data line, and the MCU 20 determines validity of rgb_data1. Therefore, without increasing the number of data lines, the validity of rgb_data1 input to the MCU 20 can be determined. Therefore, it can prevent increase in the manufacture cost of the input/output system (increase in the number of terminals of the MCU 20 and increase in the board lines) and prevent the wiring implementation from becoming difficult.

In the related art of multiplexing the data lines, for example, when both of the two data lines multiplexed are disconnected, data transmitted through the two data lines indicates the same data, so that validity of the data cannot be determined. On the other hand, in the embodiment, the camera module 10 employs the method of outputting data obtained by latching data1 at the rising edge of rgb_clk1 and data obtained by latching data1 at the falling edge of rgb_clk1 and inverting it to the MCU 20. Consequently, in the case where the data lines are disconnected, in the MCU 20, the data obtained by latching data1 at the falling edge of rgb_clk1 and inverting it is not detected, so that the validity of the data can be correctly determined.

In the related arts, even when the cycle in which the MCU 20 is to fetch data shifts, there is no means to detect the shift and the validation of the data input to the MCU 20 cannot be determined. In contrast, in the embodiment, the MCU 20 determines the validity of rgb_data1 by comparing the data obtained by latching rgb_data1 at the rising edge of rgb_clk1 and the data obtained by latching rgb_data1 at the falling edge and inverting it. Consequently, in the MCU 20, when the cycle in which rgb_data1 is to be fetched shifts, the comparison result indicates a mismatch. Therefore, the validity of rgb_data1 can be correctly determined.

Although the present invention achieved by the inventors herein has been concretely described on the basis of the embodiment, obviously, the invention is not limited to the foregoing embodiment but can be changed variously without departing from the gist.

Figure 9:
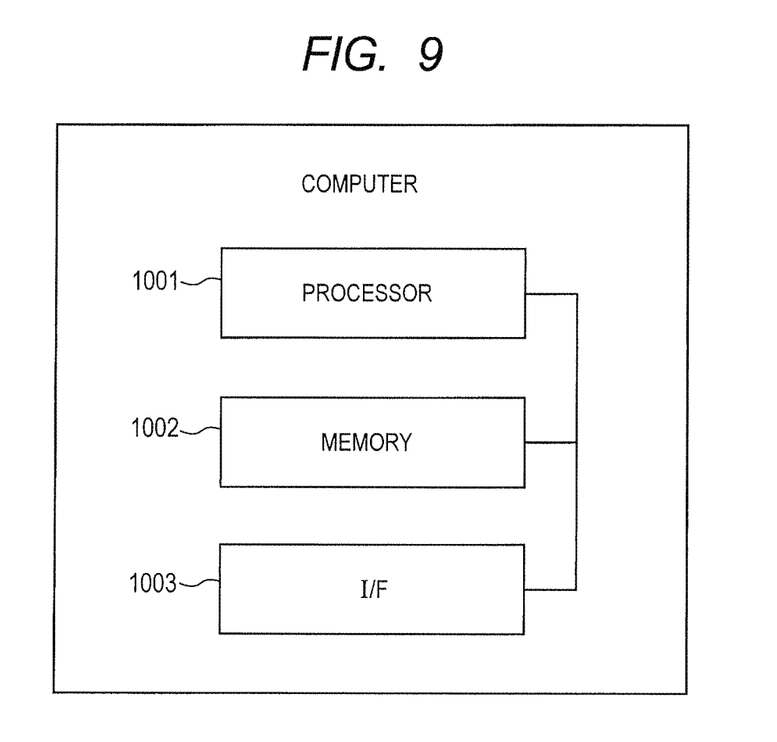
FIG. 9 is a block diagram illustrating a configuration example realizing an output data generator and input data decoder depicted in FIG. 3.

For example, the output data generator 12 in the camera module 10 and the input data detector 21 in the MCU 20 may be realized not only by hardware as described above but also realized in a software manner by a program read from a memory. In this case, as illustrated in FIG. 9, each of the output data generator 12 and the input data decoder 21 can be comprised of a computer including a processor 1001 such as a CPU performing arithmetic process, control process, or the like, a memory 1002 storing a program read and executed by the processor 1001 and various data, and an interface (I/F) 1003 inputting/outputting a signal to/from the outside. Therefore, a person skilled in the art may understand that the output data generator 12 and the input data decoder 21 can be realized in various forms by only hardware, only software, or combination of the hardware and software, and the invention is not limited to any of the forms.

The above-described program is stored by using non-transitory computer readable media of various types, and can be supplied to a computer. The non-transitory computer readable media include tangible storage media of various types. Examples of the non-transitory computer readable media include magnetic recording media (for example, flexible disk, magnetic tape, and hard disk drive), magnet-optic recording media (for example, magnet-optic disk), CD-ROM (Read Only Memory), CD-R, CD-R/W, and semi-conductor memories (for example, mask ROM, PROM (Programmable ROM), EPROM (Erasable PROM), flash ROM, and RAM (Random Access Memory)). The program may be supplied to a computer by any of transitory computer readable media of various types. Examples of the transitory computer readable media include an electric signal, an optical signal, and an electromagnetic wave. The transitory computer readable medium can supply a program to a computer via a wired communication path such as an electric wire or an optical fiber or a wireless communication path.

What is claimed is:

1. An input/output system comprising:
    an output device multiplexing data obtained by latching original data at a rising edge of a clock signal and data obtained by latching the original data at a falling edge of the clock signal and inverting the latched data, outputting the resultant data as multiplexed data, and outputting the clock signal; and
    an input device determining validity of the multiplexed data by comparing data obtained by latching the multiplexed data output from the output device at a rising edge of the clock signal and data obtained by latching the multiplexed data at a falling edge of the clock signal and inverting the latched data.

2. The input/output system according to claim 1, wherein the output device comprises:
    a first output-side flip flop circuit latching the original data at a rising edge of the clock signal;
    a second output-side flip flop circuit latching the original data at a falling edge of the clock signal;
    an output-side inverter inverting output data of the second output-side flip flop circuit;
    a multiplexer selecting output data of the output-side inverter in a state where the clock signal is at the high level and selecting output data of the first output-side flip flop circuit in a state where the clock signal is at the low level;
    a first output terminal outputting output data of the multiplexer as the multiplexed data to the input device; and
    a second output terminal outputting the clock signal to the input device, and
    wherein the input device comprises:
    a first input terminal receiving the multiplexed data from the output device;

a second input terminal receiving the clock signal from the output device;

a first input-side flip flop circuit latching the multiplexed data at a rising edge of the clock signal;

a second input-side flip flop circuit latching the multiplexed data at a falling edge of the clock signal;

a third input-side flip flop circuit making output data of the second input-side flip flop circuit synchronized with the rise of the clock signal;

an input-side inverter inverting output data of the third input-side flip flop circuit; and a determining unit determining validity of the multiplexed data by comparing output data of the first input-side flip flop circuit and output data of the input-side inverter.

3. The input/output system according to claim 2, wherein the input device further comprises a third output terminal outputting output data of the first input-side flip flop circuit.

4. The input/output system according to claim 2, wherein the determining unit generates an error determination signal indicating a result of determination of validity of the multiplexed data, and wherein the input device further comprises a fourth output terminal outputting the error determination signal.

5. The input/output system according to claim 1, wherein the output device outputs the multiplexed data to the input device via a single data line.

6. An input device comprising:

a first terminal receiving, from an output device, multiplexed data obtained by multiplexing data obtained by latching original data at a rising edge of a clock signal and data obtained by latching the original data at a falling edge of the clock signal and inverting the latched data;

a second terminal receiving the clock signal from the output device; and an input control unit determining validity of the multiplexed data by comparing data obtained by latching the multiplexed data at a rising edge of the clock signal and data obtained by latching the multiplexed data at a falling edge of the clock signal and inverting the latched data.

7. The input device according to claim 6, wherein the input control unit comprises:

a first input-side flip flop circuit latching the multiplexed data at a rising edge of the clock signal;

a second input-side flip flop circuit latching the multiplexed data at a falling edge of the clock signal;

a third input-side flip flop circuit making output data of the second input-side flip flop circuit synchronized with the rise of the clock signal;

an input-side inverter inverting output data of the third input-side flip flop circuit; and a determining unit determining validity of the multiplexed data by comparing output data of the first input-side flip flop circuit and output data of the input-side inverter.

8. The input device according to claim 6, wherein the first input terminal receives the multiplexed data from the output device via a single data line.

9. A control method of an input/output system having an output device and an input device, comprising the steps of:

multiplexing data obtained by latching original data at a rising edge of a clock signal and data obtained by latching the original data at a falling edge of the clock signal and inverting the latched data, outputting the obtained data as multiplexed data, and also outputting the clock signal by the output device; and determining validity of the multiplexed data by comparing data obtained by latching the multiplexed data output from the output device at a rising edge of the clock signal and data obtained by latching the multiplexed data at a falling edge of the clock signal and inverting the latched data by the input device.

10. The control method of an input/output system according to claim 9, wherein the output device latches the original data at a rising edge of the clock signal by a first output-side flip flop circuit;

latches the original data by a second output-side flip flop circuit at a falling edge of the clock signal;

inverts output data of the second output-side flip flop circuit by an output-side inverter;

selects output data of the output-side inverter by a multiplexer in a state where the clock signal is at the high level and selects output data of the first output-side flip flop circuit by the multiplexer in a state where the clock signal is at the low level; and outputs output data of the multiplexer as the multiplexed data to the input device and outputs the clock signal to the input device, and wherein the input device receives the multiplexed data from the output device and receives the clock signal from the output device, latches the multiplexed data at a rising edge of the clock signal by a first input-side flip flop circuit, latches the multiplexed data at a falling edge of the clock signal by a second input-side flip flop circuit, makes output data of the second input-side flip flop circuit synchronized with the rising edge of the clock signal by a third input-side flip flop circuit, inverts output data of the third input-side flip flop circuit by an input-side inverter, and determines validity of the multiplexed data by comparing output data of the first input-side flip flop circuit and output data of the input-side inverter.

11. The control method of an input/output system according to claim 9, wherein the output device outputs the multiplexed data to the input device via a single data line.

* * * * *